United States Patent [19]
Loughmiller et al.

[11] Patent Number: 5,629,843
[45] Date of Patent: May 13, 1997

[54] SELF COMPENSATING CLAMP CIRCUIT AND METHOD FOR LIMITING A POTENTIAL AT A PUMP CIRCUIT NODE

[75] Inventors: Daniel R. Loughmiller; Stephen L. Casper, both of Boise; Greg A. Blodgett, Nampa, all of Id.

[73] Assignee: Micron Technology, Inc., Boise, Id.

[21] Appl. No.: 637,008

[22] Filed: Apr. 24, 1996

Related U.S. Application Data

[63] Continuation of Ser. No. 396,311, Feb. 28, 1995, abandoned, which is a continuation-in-part of Ser. No. 137,565, Oct. 15, 1993, Pat. No. 5,394,320.

[51] Int. Cl.⁶ .................................................. H02M 7/25
[52] U.S. Cl. ................................... 363/60; 363/59
[58] Field of Search ................. 363/59, 60; 327/534, 327/536; 320/1; 307/109, 110

[56] References Cited

U.S. PATENT DOCUMENTS

| | | | |
|---|---|---|---|
| 4,839,787 | 6/1989 | Kojima et al. | 363/60 |
| 4,920,280 | 4/1990 | Cho et al. | 307/296.2 |
| 5,023,485 | 6/1991 | Douglas et al. | 365/203 |
| 5,038,325 | 8/1991 | Douglas et al. | 365/189.06 |
| 5,051,881 | 9/1991 | Herold | 363/60 |
| 5,245,524 | 9/1993 | Nakagawa et al. | 363/62 |
| 5,280,420 | 1/1994 | Rapp | 363/60 |
| 5,394,320 | 2/1995 | Blodgett | 363/60 |
| 5,436,587 | 7/1995 | Cernea | 327/60 |
| 5,438,504 | 8/1995 | Menegoli | 363/60 |

*Primary Examiner*—Robert Appi
*Assistant Examiner*—Adolf Berhane

[57] ABSTRACT

A self compensating clamp circuit and a method which limit the voltage of a pump circuit node to a maximum potential. A first pump circuit provides a first pumped potential at a first node which is greater than a supply potential. The first pumped potential is fed to a second pump circuit which generates a second pumped potential at a second node. The clamp circuit is interposed between the first and the second nodes and limits the maximum value of the first pumped potential to the second pumped potential plus a threshold voltage of the clamp circuit.

28 Claims, 4 Drawing Sheets on Feb. 28,1995 as U.S. Pat. No. 5,394,320.

SELF COMPENSATING CLAMP CIRCUIT AND METHOD FOR LIMITING A POTENTIAL AT A PUMP CIRCUIT NODE

This application is a continuation of application Ser. No. 08/396,311, filed Feb. 28, 1995, now abandoned, which is a continuation-in-part of Greg A. Blodgett's copending application having Ser. No. 08/137,565, emtitled a Low Voltage Charge Pump Circuit and Method for Pumping a Node to an Electrical Potential, filed on Oct. 15,1993, and which issues on Feb. 28,1995 as U.S. Pat. No. 5,394,320.

FIELD OF THE INVENTION

The invention relates to semiconductor circuit devices, and more particularly to charge pump circuits for providing a voltage to various components on semiconductor integrated circuits. The invention is particularly applicable to dynamic random access memory device (DRAMS).

BACKGROUND OF THE INVENTION

U.S. Pat. No. 5,038,325, entitled "High Efficiency Charge Pump Circuit" describes one charge pump and is herein incorporated by reference.

In order to pass a full charge to a DRAM memory cell through an n-channel access transistor, it is necessary to drive the gate of the n-channel access transistor to a voltage greater than the voltage used to charge the storage capacitor. Modem dynamic random access memories (DRAMs) use charge pumps to generate this higher potential.

A typical external supply potential is referred to as $V_{CCX}$. $V_{CCX}$ is often regulated. The regulated potential is referred to as $V_{CC}$. In many applications $V_{CCX}$ is equal to 5 volts and $V_{CC}$ is regulated to 3.3 volts. A potential generated in a charge pump is generally referred to as $V_{CCP}$. In typical cases $V_{CCP}$ is two volts greater than the DRAM's internal regulated voltage, or two volts above $V_{CCX}$ for DRAM's that do not use a regulated $V_{CC}$.

Previous charge pump circuits have had difficulty operating with a $V_{CC}$ below three volts. There have been attempts to design circuits to overcome this problem.

In one attempt to increase the efficiency of a charge pump having a regulated supply potential, a level translator circuit was added between the logic of the pump, and the pump capacitors. The level translator allowed the circuit to draw current from the external power source $V_{CCX}$ rather than the regulated source $V_{CC}$. With this circuit a potential of $(2V_{CCX}-V_T)$ could be passed through a pump n-channel transistor as $V_{CCP}$, where $V_T$ is the threshold voltage of the pump n-channel transistor. Thus for a $V_{CCX}$ of 4 volts, the $V_{CCP}$ is equal to 7 volts for a $V_T$ of 1 volt. This is sufficient for transferring a full $V_{CC}$ into a memory location of a DRAM. In early regulated devices, $V_{CC}$ may range from 3.5 to 4 volts. However, there is currently a trend toward lower levels of $V_{CCX}$. Current specification require $V_{CCX}$ of 2.7 to 3.6 volts, and the trend is toward even lower $V_{CCX}$ levels. In systems with low $C_{CCX}$, there is no longer a need for a regulated $V_{CC}$. Instead, $V_{CCX}$ is used throughout the circuit. $V_{CCP}$ is still required to pass a full $V_{CCX}$ in to the DRAM memory cell. As $V_{CCX}$ is reduced, the efficiency of the $V_{CCP}$ pump is also reduced since the charge available for transfer to $V_{CCP}$ is proportional to $V_{CCX}$ times the capacitance of the pump capacitor. Thus as $V_{CCX}$ is reduced, the pump eventually fails.

In another attempt $2V_{CCX}$ can be passed through as $V_{CCP}$ in a two stage pump by using one pump to generate the entire supply voltage for a second pump. This approach is inefficient for a low level supply potential and is impractical since all the charge eventually is generated from the first pump. In this configuration a very large first stage pump is required to provide the required supply potential for the second stage pump.

Thus a need exits to provide a pumped potential at the gate of the access transistor such that the full charge on the memory storage capacitor is passed through the access transistor for devices with low $V_{CCX}$.

SUMMARY OF THE INVENTION

The invention is a voltage pump having a self compensating clamp circuit and a method which limit the voltage of a pump circuit node to a maximum potential.

The voltage pump has a first pump circuit which provides a first pumped potential, at a first node, which is greater than a supply potential. The first pumped potential is fed to a second pump circuit which generates a second pumped potential at a second node. The self-compensating clamp circuit is interposed between the first and the second nodes and limits a maximum value of the first pumped potential to the second pumped potential plus a threshold voltage of the self-compensating clamp circuit.

The invention may be a memory device having the voltage pump and may be a computer system which provides the input supply potential and which increases a value of the input supply potential in a voltage pump of the computer system.

DETAILED DESCRIPTION OF THE INVENTION

The invention is a charge pump circuit and method for generating a pumped potential. In one application the pumped potential is used to pass a full charge to or from a storage;e capacitor of a dynamic random access memory (DRAM). The charge pump circuit of the invention features a first stage circuit having pump capacitors and a second stage circuit having pump capacitors. Both the first and the second stage circuits are connected to either an external supply potential or a regulated supply potential. The first stage circuit increases the supply potential to create an intermediate pumped potential which functions as a additional supply potential to the second stage circuit. There is minimal loading on the first stage associated with the charging of the second stage pump capacitors.

Figure 1:
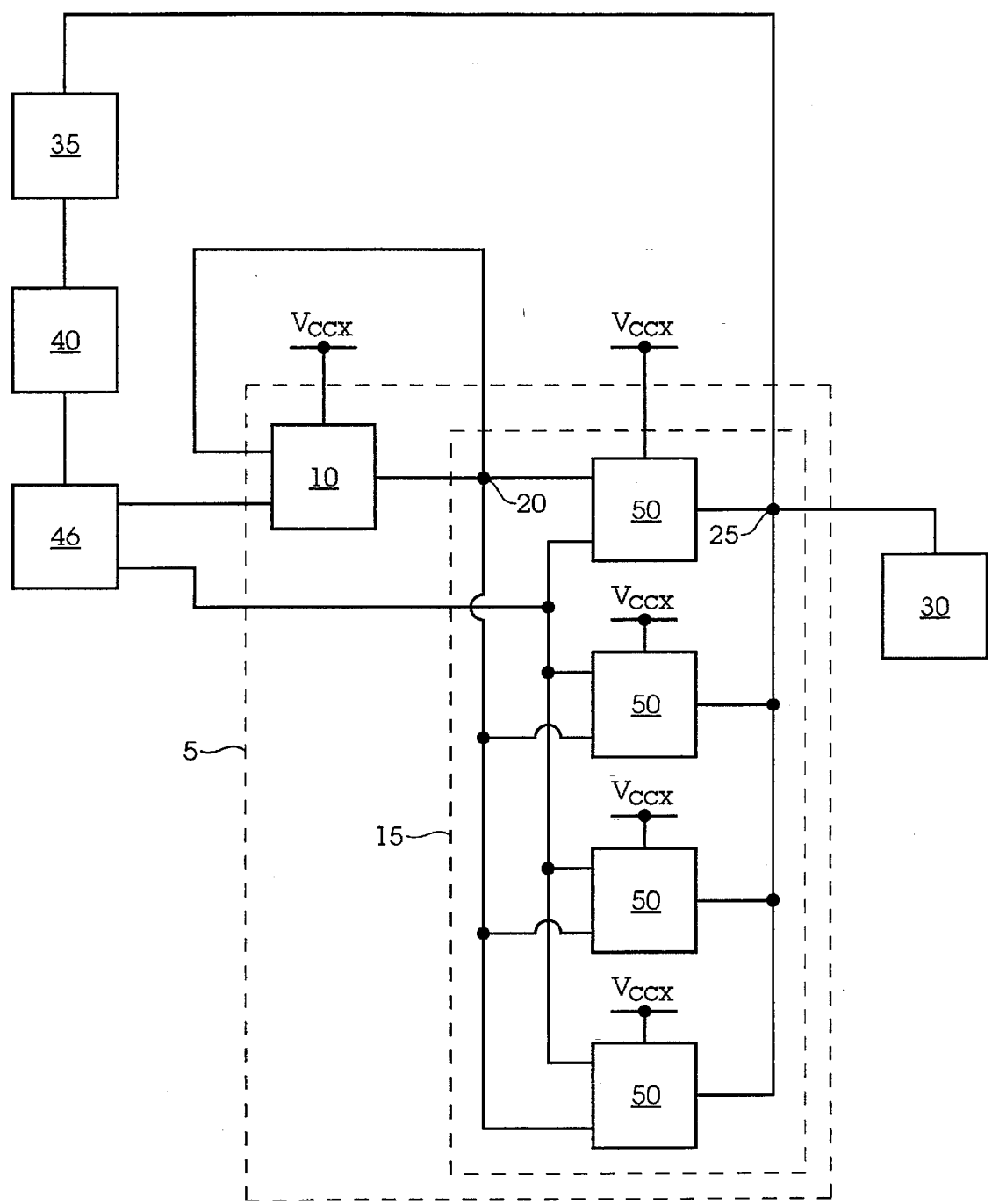
FIG. 1 is a block schematic of a circuit of the invention.

FIG. 1 is a block schematic of the charge pump circuit 5 of the invention. The charge pump circuit 5 comprises a first stage circuit 10 and a second stage circuit 15. The first stage circuit 10, which is connected to and driven by an external supply potential, $C_{ccx}$, or alternately to a regulated $C_{ccx}$, $V_{cc}$, generates the intermediate pumped potential at intermediate output node 20. The second stage circuit 15 is also connected to and driven by $C_{ccx}$, and the intermediate pumped potential is the additional supply potential to the second stage circuit 15. The second stage circuit 15 generates the pumped output potential ($V_{ccP}$) of the charge pump circuit 5 at node 25. The $V_{ccP}$ at node 25 may be used to pass charge to and from storage capacitors of a DRAM or may drive some other load 30. $V_{ccP}$ is also fed back to a voltage regulator circuit 35 which monitors the value of $V_{ccP}$. When $V_{ccP}$ falls below a desired level the voltage regulator circuit 35 actuates an oscillator circuit 40 which supplies an input signal to a logic circuit 46. The logic circuit, in response to the oscillator signal, generates logic control signals to control the generation of $V_{ccP}$ by the charge pump circuit 5. The intermediate pumped potential is greater than the supply potential of the charge pump circuit 5, and $V_{ccP}$ is greater than the intermediate pumped potential. Regulators and oscillators are well known to those skilled in the art and may be implemented with various circuit configurations.

The second stage circuit 15 of FIG. 1 comprises four subcircuits 50 configured in parallel with each other. Each subcircuit is connected to $V_{ccX}$. Each subcircuit is also connected to the intermediate node 20 and the intermediate pumped potential becomes a supply potential for a portion of each subcircuit 50. Each subcircuit 50 responds to at least one logic control signal. The actual number of subcircuits may vary and may be greater or less than four.

Figure 2:
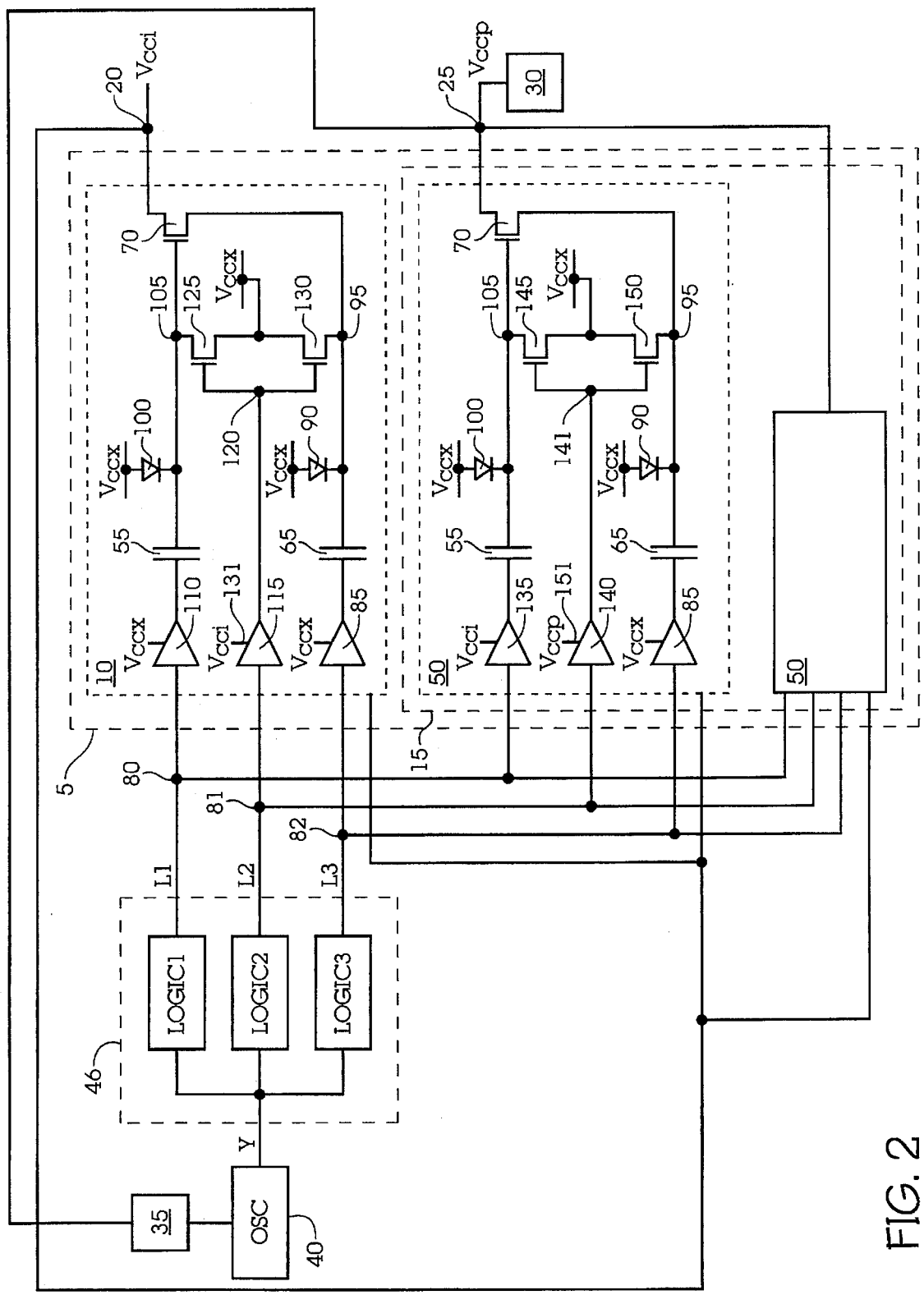
FIG. 2 is a more detailed schematic of the circuit of FIG. 1.
Figure 3A:
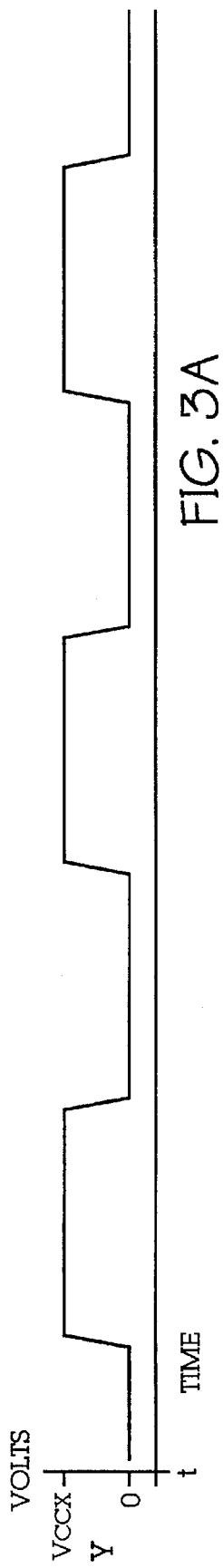
FIG. 3A–D are timing diagrams of oscillator signal used to drive logic circuitry of the invention.
Figure 3B:
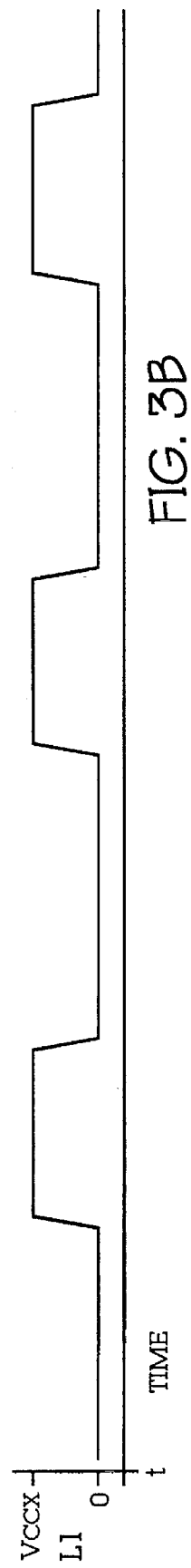
Figure 3C:
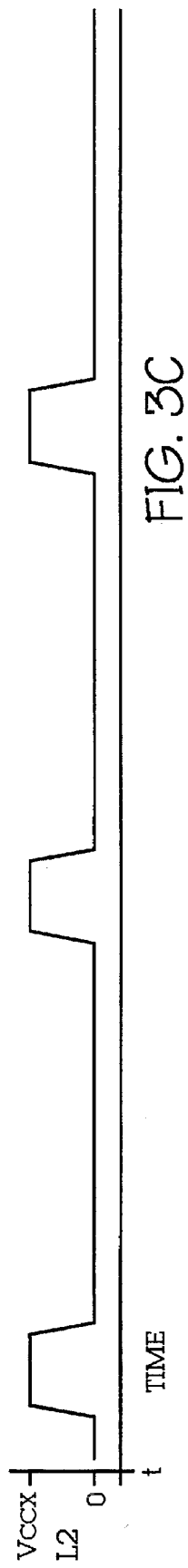
Figure 3D:
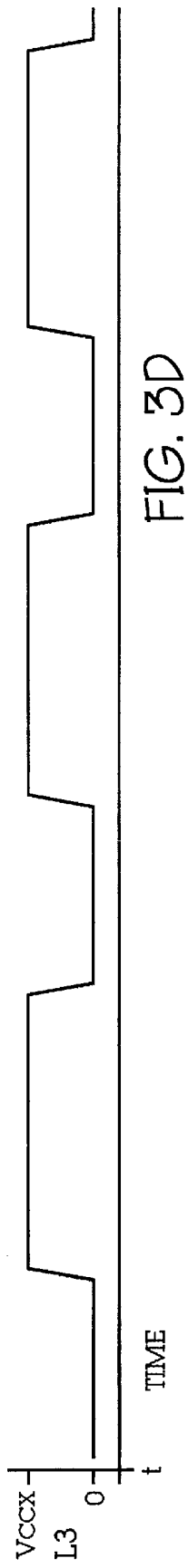

FIG. 2 is a more detailed schematic of the circuit of FIG. 1. Identical elements of FIGS. 1 and 2 have been numbered the same. Only one of the subcircuits 50 is detailed schematically in FIG. 2. The remaining three subcircuits have identical circuitry. Therefore, the description of the detailed subcircuit 50 is valid for the remaining subcircuits, and references to subcircuit 50 in the following description apply to each of the subcircuits 50. Some components in subcircuit 50 will be designated as either a "second stage" or a "first stage" component in order to distinguish similar components of the two circuit stages.

Both the first stage circuit 10 and the subcircuit 50 of the second stage circuit 15 have a small capacitor 55 and a large capacitor 65. A first stage transistor 70 passes the charge stored on the first stage large capacitor 65 to intermediate node 20 when first stage transistor 70 is gated by the charge stored on the first stage small capacitor 55, and second stage transistor 70 passes the charge stored on the second stage large capacitor 65 to output node 25 when second stage transistor 70 is gated by the charge stored on the second stage small capacitor 55.

Although in this embodiment the capacitance of the small capacitor 55 is smaller than the capacitance of the large capacitor 65 the invention is equally applicable when the capacitors have equal capacitances.

The logic circuit 46 responds to the oscillator signal and produces first (L1), second (L2), and third (L3) logic control signals at output nodes 80, 81, and 82 respectively. L1, L2, and L3 are control input signals to both the first 10 and second 15 stage circuits. Each section of the logic circuit 46 can be designed by someone skilled in the art to create the desired logic signals L1, L2, and L3 as described herein, and the exact circuitry is not detailed in this specification.

L1, L2, and L3 are periodic signals having equal periods which are equal to the period of the oscillator, however the three signals have different duty cycles, as can be seen by examining the timing diagram shown in FIG. 3. The oscillator signal is represented by Y and the logic signals are represented by L1, L2, and L3 in FIG. 3. The vertical axis represents electrical potential and the horizontal axis represents time. Signal L1 transitions low prior to L3 transitioning low and transitions high after L3 transitions high. Signal L3 is high longer than it is low, and signal L2 transitions high after both L1 and L3 transition low and returns to the low state while both L1 and L3 are still low.

Referring again to FIG. 2, it can be seen that each of the large capacitors 65 is connected to a buffer 85 which is supplied by $V_{ccX}$. Buffer 85 may alternately be a level translator in the event that the device has a regulated $V_{cc}$ which is used to generate the L1, L2, and L3. In this event 85 would translate the signal L3 from $V_{cc}$ to $V_{ccX}$. This is true in both the first stage circuit 10 and subcircuits 50.

A diode 90 is electrically interposed between each large capacitor 65 and $V_{ccX}$ and is connected to large capacitor 65 at node 95. The diode 90 holds the potential of node 95 at $V_{ccX}-V_{T1}$, where $V_{T1}$ is the threshold voltage of diode 90. A threshold voltage of a device is the minimum potential that must be applied to the device in order for the device to conduct current. When the logic circuit generates a high active signal at node 82, buffers 85 drive a high signal to their respective nodes 95 thereby increasing the potential of nodes 95 by $V_{ccX}$ and bringing the potential of nodes 95 to $2V_{ccX}-V_{T1}$.

A diode 100 is electrically interposed between each small capacitor 55 and $V_{ccX}$ and is connected to small capacitor 55 at node 105. The diode 100 holds the potential of node 105 at $V_{ccX}-V_{T2}$, where $V_{T2}$ is the threshold voltage of diode 100. When the logic circuit generates a high active signal at node 80 level buffer 110 drives a high signal to first stage node 105 thereby increasing the potential of first stage node 105 by $V_{ccX}$ and bringing the potential of first stage node 105 to $2V_{ccX}-V_{T2}$. The $2V_{ccX}-V_{T2}$ on node 105 actuates first stage transistor 70. The charge on first stage node 95 is passed through the actuated first stage transistor 70 with a $V_{T3}$ (the threshold voltage of first stage transistor 70) loss to the intermediate node 20, driving the intermediate node to a potential equal to two times $V_{ccX}$ minus $V_{T2}$ and minus $V_{T3}$. In the case where the two threshold voltages are equal the formula for $V_{ccI}$ is $2V_{ccX}-2V_{T3}$.

The potential of the intermediate node 20 is called the intermediate pumper potential, $V_{ccI}$.

A first stage precharge circuit comprises a level translator circuit 115, a common node 120, and transistors 125 and 130 electrically interposed between $V_{ccX}$ and nodes 105 and 95. Level translator circuit 115 is connected at a level translator circuit supply node 131 to the intermediate node 20. The level translator circuit 115 is interposed between output node 81 and common node 120. Common node 120 is connected to the gates of the transistors 125 and 130. When the logic signal L2 at node 81 goes high it is level translated from $V_{cc}$ or $V_{ccX}$ to the intermediate potential which in turn actuates transistors 125 and 130 thereby precharging first stage nodes 105 and 95 to a full $V_{ccX}$ level.

Since the first stage nodes 105 and 95 are precharged to the full $V_{ccX}$ level they are allowed to swing from $V_{ccX}$ to $2V_{ccX}$, rather than $2V_{CCX}-V_{T2}$, as L1 and L3 swing from 0V to $V_{CC}$. Therefore the potential at the intermediate node is now allowed to swing up to $2V_{CCX}-V_{T3}$, where $V_{T3}$ is the threshold voltage of first stage transistor 70. Once the potential of the intermediate node reaches this value, $2V_{CCX}-V_{T3}$, it is referred to as the intermediate pumped potential, $VCC_I$.

Subcircuit 50 comprises a second stage precharge circuit similar to the first stage precharge circuit. The second stage precharge circuit comprises a level translator circuit 140, a common node 141, and transistors 145 and 150. Level translator circuit 140 is connected at a level translator circuit supply node 151 to output node 25. Since the potential of the output node is the pumped potential and is greater than the intermediate pumped potential, when the logic signal L2 at node 81 goes high it is level translated from $V_{CCX}$ to $V_{CCP}$ which in turn actuates transistors 145 and 150. Therefore second stage nodes 105 and 95 are precharged to $V_{CCX}$ when L2 is high.

The $V_{CCI}$ generated by the first stage circuit 10 and equal to $2V_{CCX} V_{T3}$ becomes the supply potential for a second stage level translator circuit 135. When the logic circuit generates the high active signal at node 80, level translating circuit 135 translates the high $V_{CCI}$ to second stage node 105 which has been precharged to $V_{CCX}$. Therefore the potential of second stage node 105 is equal to $3V_{CCX}-V_{T3}$. The $3V_{CCX}-V_{T3}$ actuates second stage transistor 70 passing the full value, $2V_{CCX}$, of the potential at second stage node 95 to output node 25. The pumped potential, $V_{CCP}$, at output node 25 is therefore equal to $2V_{CCX}$ as long as $3V_{CCX}-V_{T3}-V_{T4}$, where $V_{T4}$ is the threshold voltage of the second stage transistor 70, is greater than or equal to $2V_{CCX}$. For example if all of the $V_T$S of the circuit were equal to 1 volt the circuit would not function optimally below 2 volts.

Therefore even though $V_{CCX}$ may be decreased due to design considerations the pumped output potential is not decreased by the threshold voltage, and the pumped output potential at node 25 is large enough to allow the full charge of a storage capacitor to be passed to and from the storage capacitors of a DRAM. This is true even for small supply potentials less than 3 volts.

The generation of the pumped potential of the invention is efficient since the majority of current draw of the second stage circuit is supplied by $V_{CCX}$. Thus the first stage can have a small driving capacity since it is not loaded by the second stage.

An example may help the reader appreciate the advantages of the invention. Assume $V_{CCX}$ is equal to 2 volts and all $V_T$S are equal to 1 volt. When the logic circuit 46 responds to the oscillator signal the small 55 and large 65 pump capacitors of the first stage circuit 10 charge to twice $V_{CCX}$ or 4 volts. The 4 volt potential on the first stage small pump capacitor 55 actuates first stage transistor 70. Then the 4 volt potential stored on the first stage large pump capacitor 65 is coupled to the intermediate node 20 with a 1 volt loss due to the threshold potential of the first stage transistor 70, and the intermediate pumped potential is equal to 3 volts.

Now the intermediate pumped potential is level translated to second stage node 105 which is precharged to 2 volts. Therefore the potential of second stage node 105 is equal to 5 volts. Second stage node 95 is charged to twice $V_{CCX}$ or 4 volts. The 5 volts on second stage node 105 actuates second stage transistor 70 which then passes the 4 volts on second stage node 95 to output node 20 without a loss. Thus the pumped potential at node 25 is equal to 4 volts which is sufficient to actuate an access transistor and allow a full value of a potential stored or to be stored on a storage capacitor to pass through the access transistor.

Although the invention refers to a method for pumping a supply potential to a value capable of actuating an access transistor such that the access transistor passes a full charge to and from storage capacitor of a DRAM, it is not restricted to implementations which involve memory device or semiconductor devices.

Where electrical function and connections are described, it is understood that it is possible, within the scope of this invention, to use equivalent circuits to perform the described functions. As an example, a transistor can be used as a diode or resistor. Likewise, two electrical components which are connected may have interceding components which physically separate the two components. "Connected" is therefore intended to include components which are in electrical communication despite intervening components.

The circuit and method of the invention have utility in other circuit where a pumped potential is desired and is not limited to DRAM circuits. Accordingly the invention should be read as limited only by the claims.

Figure 4:
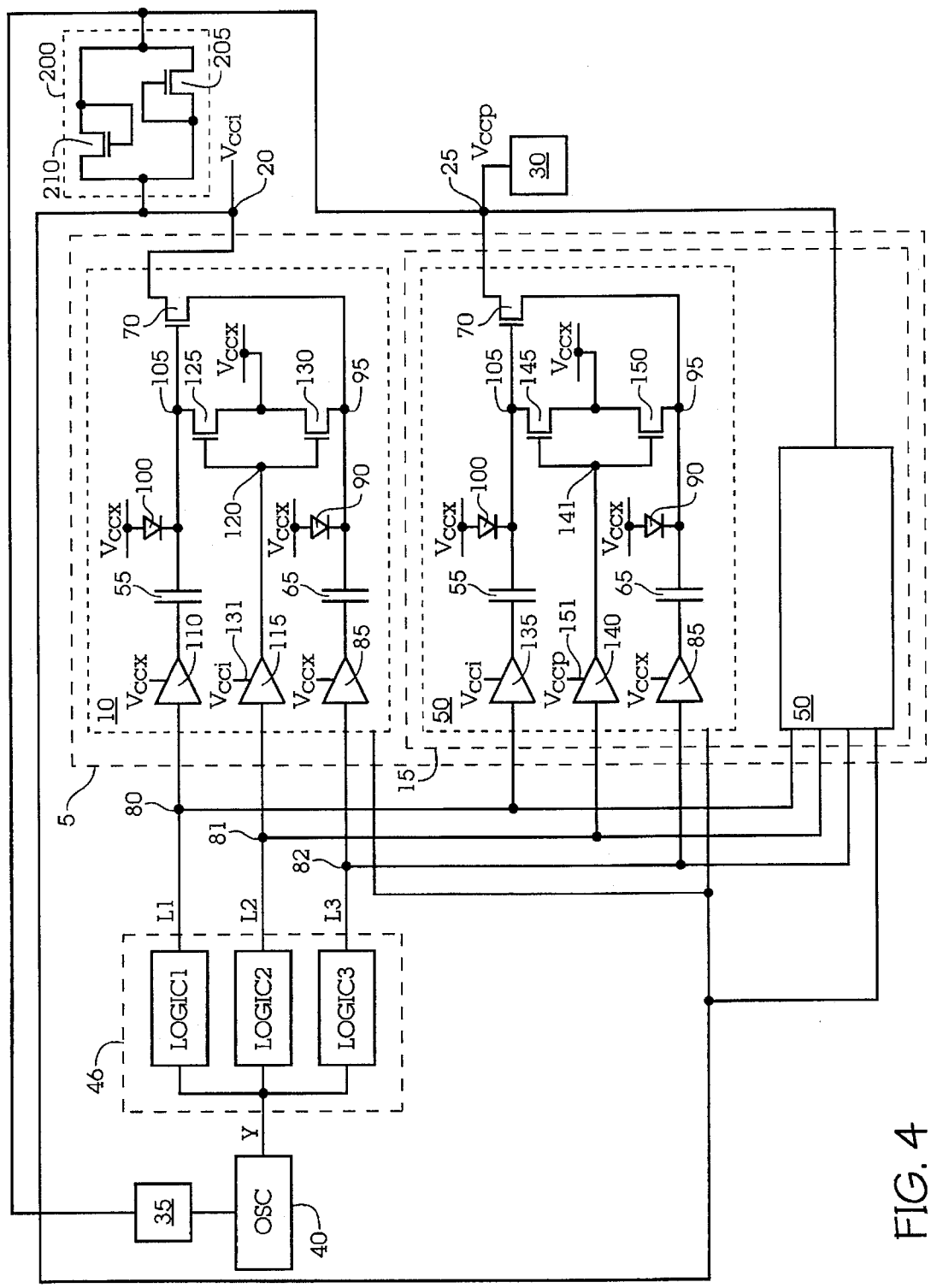
FIG. 4 is a schematic of the circuit shown in FIG. 2 with the addition of a clamp circuit.

FIG. 4 is a schematic of the circuit of FIG. 2 with the addition of a clamp circuit 200 interposed between intermediate node 20 and node 25. The clamp circuit 200 is comprised of two parallel transistors 205 and 210 configured as diodes and having forward bias threshold voltages of Vt1 and Vt2, respectively. In the circuit of FIG. 4 the oscillator signal Y is controlled by the regulator circuit 35 which is dependent on the value of Vccp. When the oscillator signal is cycling the first stage circuit 10 increases the value of an input supply potential to an intermediate potential, Vcci, and the subcircuits 50 typically increase a value of the potential on node 25 to Vccp, although a load may hold Vccp less than Vcci. The oscillator signal Y is controlled by the regulator circuit 35 which is dependent upon the Vccp level at node 25. When the intermediate potential exceeds a voltage of Vccp+Vt1 transistor 205 conducts holding the value of Vcci to within a Vt1 of Vccp. As the intermediate potential rises so does the output potential, Vccp. As the potential of Vccp increases it eventually reaches a point at which the regulator circuit 35 turns off the oscillator circuit 40 which, in turn, shuts off the first stage circuit 10 and subcircuits 50 thereby temporarily terminating the generation of Vcci and Vccp. When the pumping terminates Vccp and Vcci are approximately equal to the maximum potential in the range of potentials to which they are clamped by clamp circuit 200.

When VCCi decreases to a value which is less than Vccp by a Vt2 current flows from intermediate node 20 to node 25 through forward biased transistor 210. Transistor 210 effectively clamps the minimum potential of node 20 to within a Vt2 of vccp. Decreases in Vccp turn on the regulator circuit 35 which turns on the oscillator circuit 40 thereby initiating further pumping of the supply potential.

Although the invention has been described for the case in which Vcci and Vccp are both clamped within a threshold voltage of each other, a maximum limiting of Vccp is not as critical as a maximum limiting of Vcci. Transistor 210 may be useful in keeping Vcci above a minimum potential while the pump is turned off. In the event of leakage from the Vcci node, transistor 210 would keep Vcci within a Vt of Vccp. In a typical application this will not be a significant increase in the Vccp load.

However, there is a possibility that the intermediate node may achieve excessively high potentials especially at high Vcc levels since the first stage pump must be large enough to supply current to part of the second stage pump even at low Vcc levels and since Vcci is typically very lightly loaded at high Vcc levels. Thus it is possible for Vcci to increase rapidly towards its maximum potential. It is therefore desirable to clamp the maximum potential of Vcci with transistor 205 to Vccp plus the threshold voltage of the clamp circuit as Vccp slowly rises, due to its load, to a potential high enough to mm off the regulator. Thus an alternate embodiment of the invention may eliminate transistor 210 while retaining transistor 205 of the clamp circuit 200.

Thus voltage pump generator 5 of the invention comprises a self-compensating clamp circuit and method which limit a range of potentials to which a node of the voltage pump generator may be pumped.

Although the circuit has been shown for a voltage pump which generates a positive potential one skilled in the art will recognize that the invention is also applicable for a voltage pump which generates a negative potential.

What is claimed is:

1. A circuit for increasing a value of an input supply potential, comprising:
   a) a first pump circuit configured to provide a first pumped potential greater than the input supply potential;
   b) a second pump circuit configured to provide a second pumped potential, wherein said second pump circuit comprises;
      i) a switching device having a control terminal, a first terminal, and a second terminal;
      ii) a first increasing circuit configured to provide a first increased potential greater than the input supply potential at the first terminal of said switching device;
      iii) a precharge circuit configured to precharge said control terminal to a potential having a value less than the input supply potential;
      iv) a second increasing circuit configured to increase the potential of the control terminal to a second increased potential having a value greater than the input supply potential, said switching device actuated by the second increased potential to drive the second pumped potential to the second terminal; and
   c) a clamp circuit electrically interposed between said first pump circuit and the second terminal of the switching device, said clamp circuit configured to limit at least one of said first and said second pumped potentials to within a range of potentials.

2. The circuit as specified in claim 1, wherein said second increasing circuit increases the potential of the control terminal to a value greater than the potential at the first terminal of the switching device.

3. A circuit for increasing a value of an input supply potential, comprising:
   a) an input supply node connectable to the input supply potential;
   b) a first stage circuit in electrical communication with the input supply node, said first stage circuit configured to generate a first stage output potential greater than the input supply potential at a first stage output node;
   c) a second stage circuit in electrical communication with the input supply node and the first stage circuit, said second stage circuit comprising a transistor, a first terminal of said transistor being a second stage output node of said second stage circuit, said second stage circuit configured to generate a second stage output potential at the second stage output node; and
   d) a limiting circuit electrically interposed between the first stage circuit and the second stage circuit, said limiting circuit configured to limit a maximum value of the first stage output potential to the second stage output potential plus a threshold voltage of said limiting circuit.

4. The circuit as specified in claim 3, wherein said limiting circuit further limits a maximum value of the second stage output potential to a value of the first stage output potential plus a further threshold voltage of said limiting circuit.

5. The circuit as specified in claim 3, wherein said limiting circuit is electrically interposed between the first stage output node and the second stage output node.

6. The circuit as specified in claim 3, further comprising:
   a) a first diode interposed between said second stage output node and said first stage output node, said first diode conducting current when the first stage output potential is less than the second stage output potential; and
   b) a second diode interposed between said second stage output node and said first stage output node, said second diode conducting current when the second stage output potential is less than the first stage output potential.

7. The circuit as specified in claim 6, wherein:
   a) said first diode is a first transistor; and wherein
   b) said second diode is a second transistor.

8. A voltage pump for increasing a value of an input supply potential, comprising:
   a) an input supply node connectable to the input supply potential;
   b) a first stage output node;
   c) a first circuit portion in electrical communication with the input supply node, said first circuit portion configured to generate a first boosted potential;
   d) a first stage switching device having a gate, a gate potential at said gate determining an actuation and deactuation of said first stage switching device, said first stage switching device electrically interposed between said first stage output node and said first circuit portion, said first stage switching device configured to electrically isolate said first stage output node from said first circuit portion when deactuated and to electrically couple said first circuit portion to said first stage output node when actuated;
   e) a second circuit portion in electrical communication with the input supply node, said second circuit portion configured to generate a first stage actuation potential, greater than the input supply potential, at said gate of said first stage switching device such that said first stage switching device drives, when actuated by the first stage actuation potential, a potential of the first stage output node toward the first boosted potential minus a threshold voltage of said first stage switching device, the potential of the first stage output node being called an intermediate potential, wherein said intermediate potential is greater than the input supply potential;
   f) a second stage output node;
   g) a third circuit portion in electrical communication with the input supply node, said third circuit portion generating a second boosted potential;
   h) a second stage switching device having a gate, a gate potential at said gate of said second stage switching device determining an actuation and deactuation of said second stage switching device, said second stage switching device electrically interposed between said second stage output node and said third circuit portion, said second stage switching device configured to electrically isolate said second stage output node from said third circuit portion when deacylated and to electrically couple said third circuit portion to said second stage output node when actuated;
   i) a fourth circuit portion in electrical communication with the first stage output node, said fourth circuit portion configured to generate a second stage actuation potential at said gate of said second stage switching device such that said second stage switching device drives, when actuated by the second stage actuation potential, a potential of said second stage output node toward said second boosted potential; and
   j) a limiting circuit electrically interposed between said first stage output node and said second stage output node and configured to limit a maximum value of the intermediate potential to a potential on the second stage output node plus a threshold voltage of said limiting circuit.

9. The voltage pump as specified in claim 8, wherein said limiting circuit further limits a maximum value of the second boosted potential to the intermediate potential plus a further threshold voltage of said limiting circuit.

10. A voltage pump for increasing a value of an input supply potential, comprising:

a) an input supply node connectable to the input supply potential;
   b) a first stage output node;
   c) a first circuit portion in electrical communication with the input supply node, said first circuit portion configured to generate a first boosted potential;
   d) a first stage switching device having a gate, a gate potential at said gate determining an actuation and deactuation of said first stage switching device, said first stage switching device electrically interposed between said first stage output node and said first circuit portion, said first stage switching device configured to electrically isolate said first stage output node from said first circuit portion when deacylated and to electrically couple said first circuit portion to said first stage output node when actuated;
   e) a second circuit portion in electrical communication with the input supply node, said second circuit portion configured to generate a first stage actuation potential, greater than the input supply potential, at said gate of said first stage switching device such that said first stage switching device drives, when actuated by the first stage actuation potential, a potential of the first stage output node toward the first boosted potential minus a threshold voltage of said first stage switching device, of the first stage output node being called an intermediate potential, wherein said intermediate potential is greater than the input supply potential;
   f) a second stage output node;
   g) a third circuit portion in electrical communication with the input supply node, said third circuit portion configured to generate a second boosted potential;
   h) a second stage switching device having a gate, a gate potential at said gate of said second stage switching device determining an actuation and deactuation of said second stage switching device, said second stage switching device electrically interposed between said second stage output node and said third circuit portion, said second stage switching device configured to electrically isolate said second stage output node from said third circuit portion when deacylated and to electrically couple said third circuit portion to said second stage output node when actuated;
   i) a fourth circuit portion in electrical communication with the first stage output node, said fourth circuit portion configured to generate a second stage actuation potential at said gate of said second stage switching device such that said second stage switching device drives, when actuated by the second stage actuation potential, a potential of the second stage output node toward said second boosted potential; and
   j) a diode electrically interposed between said second stage output node and said first stage output node, said diode configured to conduct current when a potential on the second stage output node is less than the intermediate potential.

11. The voltage pump as specified in claim 10, further comprising a further diode electrically interposed between said second stage output node and said first stage output node, said further diode configured to conduct current when the intermediate potential is less than the second boosted potential.

12. A method for increasing a value of a supply potential, comprising the following steps:

a) pumping a potential of a first node to a first pumped potential greater than the supply potential;
   b) pumping a potential of a first terminal of a switching device to a potential greater than the supply potential:
   c) increasing a potential of a control terminal of the switching device to a value greater than the supply potential:
   d) driving a potential of a second terminal of the switching device to a second pumped potential greater than the supply potential; and
   e) limiting a maximum value of the first pumped potential to a value of the second pumped potential plus a threshold voltage of a circuit used to perform said step of limiting.

13. The method as specified in claim 12, further comprising the step of limiting a maximum value of the second pumped potential to the first pumped potential plus a further threshold voltage of the circuit used to perform said step of limiting.

14. A method for increasing a value of a supply potential, comprising the following steps:

a) increasing a first control potential of a first control node by a value of the supply potential;
   b) actuating a first switching device in response to said step of increasing the first control potential;
   c) increasing a potential of a first terminal of said first switching device to a value greater than said supply potential;
   d) driving said potential of said first terminal to a second terminal of said first switching device with a loss equal to a threshold voltage of said first switching device, said potential on said second terminal being an intermediate potential which is greater than the supply potential;
   e) increasing a second control potential of a second control node by a value of said intermediate potential;
   f) actuating a second switching device in response to said step of increasing the second control potential;
   g) driving an output potential to an output node through said second switching device, said second control potential equal to or greater than said output potential plus a threshold voltage of said switching device; and
   h) limiting a potential difference between the output potential and the intermediate potential.

15. A method for increasing a value of a supply potential, comprising the following steps:

a) increasing a first control potential of a first control node by a value of the supply potential;
   b) actuating a first switching device in response to said step of increasing the first control potential;
   c) increasing a potential of a first terminal of said first switching device to a value greater than said supply potential;
   d) driving said potential of said first terminal to a second terminal of said first switching device with a loss equal to a threshold voltage of said first switching device, said potential on said second terminal being an intermediate potential which is greater than the supply potential;

e) increasing a second control potential of a second control node by a value of said intermediate potential;

f) actuating a second switching device in response to said step of increasing the second control potential;

g) driving an output potential to an output node through said second switching device, said second control potential equal to or greater than said output potential plus a threshold voltage of said switching device; and h) clamping at least one of the intermediate potential and the output potential within a desired range of potentials.

16. A method for increasing a value of a supply potential, comprising the following steps:

a) increasing a first control potential of a first control node by a value of the supply potential; b) actuating a first switching device in response to said step of increasing the first control potential;

c) increasing a potential of a first terminal of said first switching device to a value greater than said supply potential;

d) driving said potential of said first terminal to a second terminal of said first switching device with a loss equal to a threshold voltage of said first switching device, said potential on said second terminal being an intermediate potential which is greater than the supply potential;

e) increasing a second control potential of a second control node by a value of said intermediate potential;

f) actuating a second switching device in response to said step of increasing the second control potential;

g) driving an output potential to an output node through said second switching device, said second control potential equal to or greater than said output potential plus a threshold voltage of said switching device; and h) conducting current between said second terminal and said output node when a potential difference between said second terminal sand said output node exceeds a threshold voltage.

17. The method as specified in claim 16, further comprising the step of limiting a maximum of the potential difference between said second terminal and said output node to the threshold voltage.

18. A voltage pump for increasing a value of an input supply potential, comprising:

a) a pump circuit for providing an intermediate potential greater than the input supply potential;

b) an output node;

c) a first circuit portion for providing a boosted potential greater than the input supply potential;

d) a switching device having a gate, a gate potential at said gate of said switching device determining an actuation and deactuation of said switching device, said switching device electrically interposed between said output node and said first circuit portion, said switching device electrically isolating said output node from said first circuit portion when deactuated and electrically coupling said first circuit portion to said output node when actuated;

e) a second circuit portion in electrical communication with the pump circuit, said second circuit portion generating an actuation potential at said gate of said switching device such that said switching device couples, when actuated by the actuation potential, said boosted potential to the output node; and f) a limiting circuit to limit a maximum value of the intermediate potential to a potential on the output node plus a threshold voltage of said limiting circuit.

19. A method for increasing a value of a supply potential comprising the following steps:

pumping a potential of a first node to an intermediate potential greater than the supply potential;

b) increasing a potential of a control node by a value of said intermediate potential;

c) actuating a switching device in response to said step of increasing;

d) driving an output potential to an output node through said switching device, said potential on said control node equal to or greater than said output potential plus a threshold voltage of said switching device; and e) limiting a potential difference between the output potential and the intermediate potential.

20. A semiconductor memory device, comprising:

a) an input supply node connectable to an input supply potential;

b) a first stage circuit in electrical communication with the input supply node, said first stage circuit configured to generate a first stage output potential greater than the input supply potential;

c) a second stage circuit in electrical communication with the input supply node and the first stage circuit, said second stage circuit comprising a transistor, a first terminal of said transistor being a second stage output node of said second stage circuit, said second stage circuit configured to generate a second stage output potential at the second stage output node; and d) a limiting circuit electrically interposed between the first stage circuit and the second stage circuit, said limiting circuit configured to limit a maximum value of the first stage output potential to the second stage output potential plus a threshold voltage of said limiting circuit.

21. A computer system providing an input supply potential and increasing a value of the input supply potential, comprising:

a) a first stage circuit configured to receive the input supply potential, said first stage circuit configured to generate a first stage output potential greater than the input supply potential;

b) a second stage circuit configured to receive the input supply potential and the first stage output potential, said second stage circuit comprising a transistor, a terminal of said transistor being a second stage output node of said second stage circuit, said second stage circuit configured to generate a second stage output potential at the second stage output node; and c) a limiting circuit electrically interposed between the first stage circuit and the second stage circuit, said limiting circuit configured to limit a maximum value of the first stage output potential to the second stage output potential plus a threshold voltage of said limiting circuit.

22. The computer system as specified in claim 21, wherein said limiting circuit further limits a maximum value of the second stage output potential to the first stage output potential plus a further threshold voltage of the limiting circuit.

23. A voltage pump for increasing a value of an input supply potential, comprising:

a) a first circuit portion responsive to the input supply potential and configured to generate an intermediate potential greater than the input supply potential;

b) a second circuit portion responsive to the input supply potential and configured to generate a boosted potential greater than the intermediate potential;

c) a switching device having a first terminal for receiving the boosted potential from the second circuit portion and having a gate;

d) a third circuit portion responsive to the intermediate potential and configured to generate a gate potential greater than the intermediate potential at the gate of said switching device such that said switching device couples, when actuated by the gate potential, the first terminal to a second terminal of said switching device; and e) a clamp circuit electrically interposed between said first circuit portion and the second terminal of said switching device, said clamp circuit configured to limit the value of at least one of said first and said second pumped potentials to within a range of potentials.

24. A voltage pump for increasing a value of an input supply potential, comprising:

a) a first circuit portion responsive to the input supply potential and configured to generate an intermediate potential greater than the input supply potential;

b) a second circuit portion responsive to the input supply potential and configured to generate a boosted potential greater than the intermediate potential;

c) a switching device having a first terminal for receiving the boosted potential from the second circuit portion and having a control terminal;

d) a third circuit portion responsive to the intermediate potential and configured to generate a control potential greater than the intermediate potential at the control terminal of said switching device such that said switching device couples, when actuated by the control potential, the first terminal to a second terminal of said switching device; and e) a limiting circuit electrically interposed between the first circuit portion and the second terminal of the switching device, said limiting circuit configured to limit a maximum value of the intermediate potential to the boosted potential plus a threshold voltage of said limiting circuit.

25. A circuit for increasing a value of an input supply potential, comprising:

a) a first pump circuit configured to provide a first pumped potential greater than the input supply potential;

b) a second pump circuit configured to provide a second pumped potential, wherein said second pump circuit comprises;

i) a transistor having a control terminal, a first terminal, and a second terminal;

ii) a first increasing circuit configured to provide a first increased potential greater than the input supply potential at the first terminal of said transistor;

iii) a precharge circuit for precharging the control terminal to a potential having a value less than the input supply potential;

iv) a second increasing circuit for increasing the potential of the control terminal to a second increased potential having a value greater than the input supply potential, said transistor actuated by the second increased potential to drive the second pumped potential to the second terminal; and c) a limiting circuit electrically interposed between the first stage circuit and the second stage circuit, said limiting circuit configured to limit a maximum value of the first pumped potential to the second pumped potential plus a threshold voltage of said limiting circuit.

26. A circuit for increasing a value of an input supply potential, comprising:

a) an input supply node connectable to the input supply potential;

b) a first stage circuit in electrical communication with the input supply node, said first stage circuit generating a first stage output potential greater than the input supply potential at a first stage output node;

c) a second stage circuit in electrical communication with the input supply node and the first stage circuit, said second stage circuit comprising a transistor, a terminal of said transistor being a second stage output node of said second stage circuit, said second stage circuit configured to generate a second stage output potential at the second stage output node; and d) a clamp circuit electrically interposed between said first stage output node and said second stage output node, said clamp circuit configured to limit at least one of said first and said second pumped potentials to within a range of potentials.

27. A method for increasing a value of an input supply potential, comprising the following steps:

a) pumping a potential of an intermediate node to an intermediate potential greater than the input supply potential;

b) increasing a potential of a control node of a switching device by a value substantially equal to said intermediate potential, wherein the potential of the control node is greater than the intermediate potential;

c) increasing a value of a potential of a first terminal of the switching device by a value of the input supply potential to create a boosted potential at the first terminal;

d) actuating the switching device with the potential of said control node;

e) coupling the first terminal to a second terminal of the switching device during said step of actuating;

f) driving an output potential to the second terminal of the switching device; and g) limiting a maximum value of the intermediate potential to the output potential plus a threshold voltage of said limiting circuit.

28. A method for increasing a value of an input supply potential, comprising the following steps:

a) pumping a potential of an intermediate node to an intermediate potential greater than the input supply potential;

b) increasing a potential of a control node of a switching device by a value substantially equal to said intermediate potential, wherein the potential of the control node is greater than the intermediate potential;

c) increasing a value of a potential of a first terminal of the switching device by a value of the input supply potential to create a boosted potential at the first terminal;

d) actuating the switching device with the potential of said control node; and e) coupling the first terminal to a second terminal of the switching device during said step of actuating;

f) driving an output potential to the second terminal of the switching device; and g) clamping at least one of the intermediate potential and the output potential to within a range of potentials.

* * * * *

UNITED STATES PATENT AND TRADEMARK OFFICE
CERTIFICATE OF CORRECTION

PATENT NO. : 5,629,843
DATED : May 13, 1997
INVENTOR(S) : Loughmiller et al.

It is certified that error appears in the above-indentified patent and that said Letters Patent is hereby corrected as shown below:

Column 1, line 8, please delete "emtitled" and replace with -- entitled --.
Column 1, line 29, please delete "Modem" and replace with -- Modern --.
Column 2, line 47, please delete "storage;e" and replace with -- storage --.
Column 2, line 62, please delete both occurrances of "Cccx" and replace with -- Vccx --. (The ccx should be subscript).
Column 2, line 65, please delete "Cccx" and replace with -- Vccx --. (The ccx should be subscript).
Column 5, line 7, please delete "2VccxVT3" and replace with -- 2Vccx-VT3 --. (The ccx and T3 should be subscript).
Column 5, line 42, please delete "65" and replace with -- 75 --.
Column 6, line 38, please delete "vccp" and replace with -- Vccp --.
Column 6, line 60, please delete "mm" and replace with -- turn --.
Column 8, line 55 please delete "deacylated" and replace with -- deactuated --.
Column 9, line 24, please delete "deacylated" and replace with -- deactuated --.
Column 9, line 37, after "device," please add -- the potential --.
Column 9, line 52, please delete "deacylated" and replace with -- deactuated --.

Signed and Sealed this

Fourteenth Day of October, 1997

Attest:

Attesting Officer

BRUCE LEHMAN

Commissioner of Patents and Trademarks